United States Patent
Nakayama

(10) Patent No.: US 7,528,034 B2
(45) Date of Patent: May 5, 2009

(54) METHOD FOR FORMING FERROELECTRIC CAPACITOR, FERROELECTRIC CAPACITOR AND ELECTRONIC DEVICE

(75) Inventor: Masao Nakayama, Chino (JP)

(73) Assignee: Seiko Epson Corporation (JP)

( * ) Notice: Subject to any disclaimer, the term of this patent is extended or adjusted under 35 U.S.C. 154(b) by 284 days.

(21) Appl. No.: 11/405,607

(22) Filed: Apr. 17, 2006

(65) Prior Publication Data

US 2006/0252223 A1 Nov. 9, 2006

(30) Foreign Application Priority Data

May 9, 2005 (JP) ............................. 2005-135998

(51) Int. Cl.
*H01L 21/8242* (2006.01)
(52) U.S. Cl. ........................... 438/240; 438/3; 438/238; 257/295
(58) Field of Classification Search ............... 438/3, 438/238, 239, 396, 240; 257/295
See application file for complete search history.

(56) References Cited

U.S. PATENT DOCUMENTS

| | | | |
|---|---|---|---|
| 5,658,820 A | | 8/1997 | Chung |
| 6,295,195 B1 * | 9/2001 | Maejima | .................. 361/301.3 |
| 7,368,388 B2 * | 5/2008 | Small et al. | .................. 438/692 |
| 2003/0098497 A1 * | 5/2003 | Solayappan et al. | ......... 257/629 |
| 2003/0157734 A1 * | 8/2003 | Engelhardt et al. | ............. 438/3 |
| 2003/0176073 A1 * | 9/2003 | Ying et al. | .................. 438/710 |

FOREIGN PATENT DOCUMENTS

| | | |
|---|---|---|
| JP | 2003-243623 | 8/2003 |
| KR | 96-36048 | 10/1996 |

* cited by examiner

*Primary Examiner*—Phuc T Dang
(74) *Attorney, Agent, or Firm*—Harness, Dickey & Pierce, P.L.C.

(57) ABSTRACT

A method for forming a ferroelectric capacitor includes the steps of (a) forming a first conductive layer above a base substrate, (b) forming, on the first conductive layer, a ferroelectric layer containing a ferroelectric material having oxygen, (c) forming a second conductive layer on the ferroelectric layer, (d) forming a mask on the second conductive layer, (e) etching at least the second conductive layer using the mask, to form a capacitor composed of the first conductive layer, the ferroelectric layer and the second conductive layer, (f) adhering fluorine to an exposed surface of the ferroelectric layer that is exposed by the etching after the step (e), and (g) applying heat treatment to the capacitor.

1 Claim, 6 Drawing Sheets

FIG. 10A
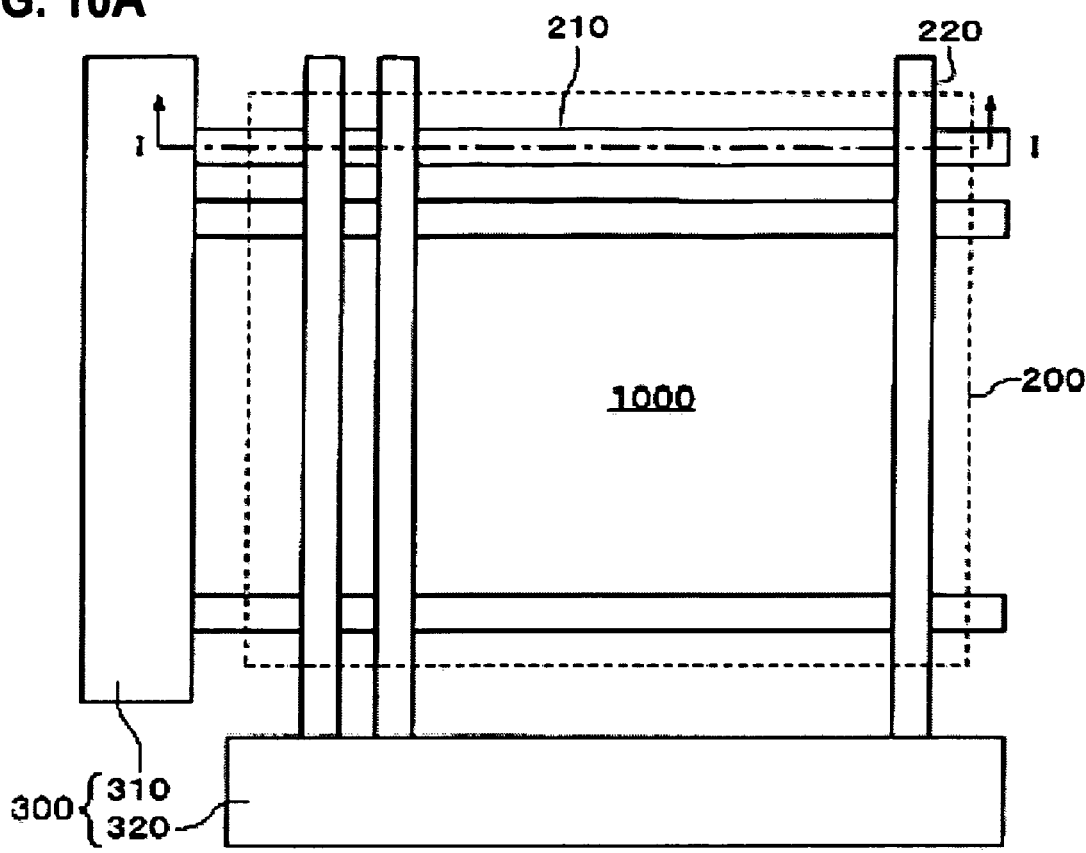
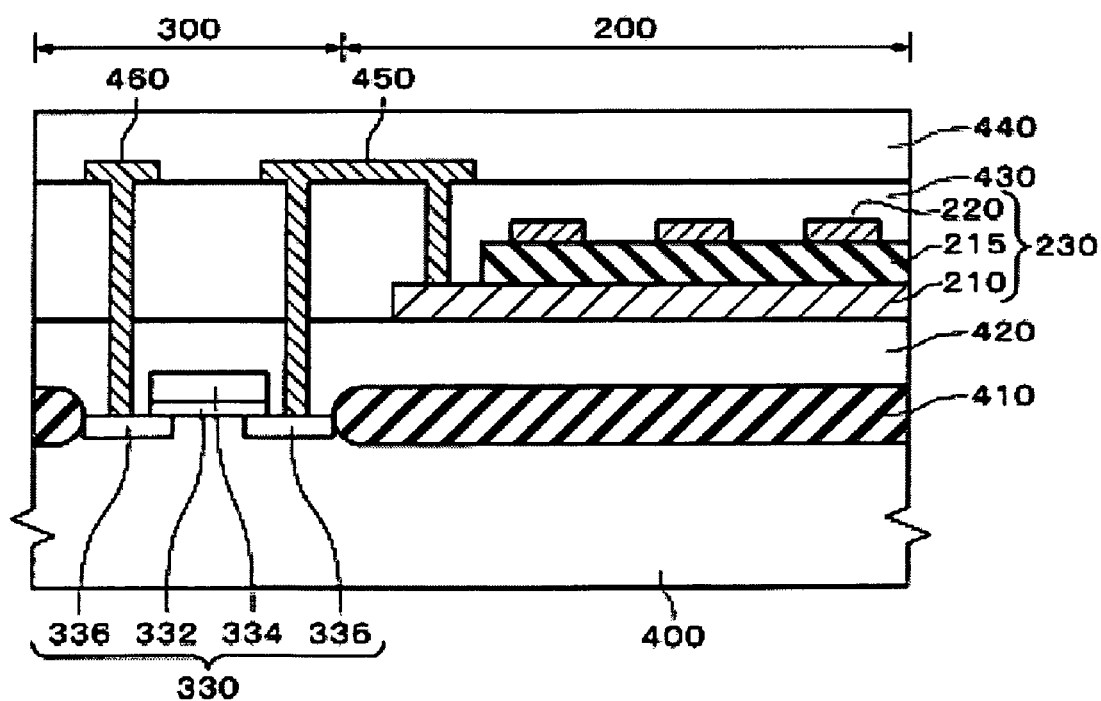
FIG. 10B

METHOD FOR FORMING FERROELECTRIC CAPACITOR, FERROELECTRIC CAPACITOR AND ELECTRONIC DEVICE

The entire disclosure of Japanese Patent Application No. 2005-135998, filed May 9, 2005 is expressly incorporated by reference herein.

BACKGROUND

1. Technical Field

The present invention relates to methods for forming ferroelectric capacitors, ferroelectric capacitors and electronic devices.

2. Related Art

Ferroelectric memories are RAMs that use a ferroelectric layer as a capacitor dielectric layer, and attracting attention as RAMs that can read and write at high speed. A ferroelectric capacitor included in such a ferroelectric memory has a structure in which a ferroelectric film is formed between a lower electrode and an upper electrode, and can be formed by patterning with dry etching. An example of related art is described in Japanese Laid-open Patent Application JP-A-2003-243623.

When the ferroelectric capacitor described above is formed, the ferroelectric layer may be damaged when the upper electrode is formed, or when dry etching is conducted for patterning. Such damage may destroy the crystal structure of the ferroelectric layer, which would lead to deterioration of the electrical characteristics of the ferroelectric capacitor. For this reason, heat treatment for recovering the crystallinity of the ferroelectric layer may be conducted after patterning is completed. In order to sufficiently recover the crystal structure in the heat treatment, it is necessary to increase the heat treatment temperature to a higher level, or conduct the heat treatment for a longer period of time. However, in either of the cases, compositions (for example, Pb) composing the ferroelectric layer may evaporate, or diffuse into the lower electrode and the upper electrode. This may also lead to deterioration of the electrical characteristics.

SUMMARY

According to an advantage of some aspects of the present invention, there are provided methods for forming a ferroelectric capacitor with excellent characteristics whose crystallinity can be recovered well, and ferroelectric capacitors having such characteristics. Also, in accordance with an aspect of the invention, an electronic device including the ferroelectric capacitor described above is provided.

(1) A method for forming a ferroelectric capacitor in accordance with an embodiment of the invention includes the steps of: (a) forming a first conductive layer above a base substrate; (b) forming, on the first conductive layer, a ferroelectric layer containing a ferroelectric material having oxygen; (c) forming a second conductive layer on the ferroelectric layer; (d) forming a mask on the second conductive layer; (e) etching at least the second conductive layer using the mask, to form a capacitor composed of the first conductive layer, the ferroelectric layer and the second conductive layer; (f) adhering fluorine to an exposed surface of the ferroelectric layer that is exposed by the etching, after the step (e); and (g) applying heat treatment to the capacitor.

According to the method for forming a ferroelectric capacitor in accordance with the present embodiment, after fluorine is adhered to a surface of the ferroelectric layer in the step (f), heat treatment is conducted in the step (g), whereby recovery of the crystallinity of the ferroelectric layer that may have been damaged by the patterning step or the like can be promoted. Accordingly, a ferroelectric capacitor having a ferroelectric film with excellent crystalinity can be formed. As a result, a ferroelectric capacitor with excellent hysteresis characteristics can be provided.

It is noted that, in the invention, forming a specific member (hereafter referred to as "B") above another specific member (hereafter referred to as "A") includes a case of forming "B" directly on "A," and a case of forming "B" over "A" through another member on "A."

(2) A method for forming a ferroelectric capacitor in accordance with another embodiment of the invention includes the steps of: (a) forming a first conductive layer above a base substrate; (b) forming a ferroelectric layer containing ferroelectric material having oxygen on the first conductive layer; (c) forming a second conductive layer on the ferroelectric layer; (d) forming a mask on the second conductive layer; (e) etching at least the second conductive layer using the mask, to form a capacitor composed of the first conductive layer, the ferroelectric layer and the second conductive layer; (f) replacing at least a portion of the oxygen of the ferroelectric material with fluorine after the step (e); and (g) applying heat treatment to the capacitor.

According to the method for forming a ferroelectric capacitor in accordance with the present embodiment, a portion of oxygen of the ferroelectric material composing the ferroelectric layer is replaced with fluorine in the step (f), and in this state, heat treatment is conducted in the step (g), whereby recovery of the crystallinity of the ferroelectric layer that may have been damaged in the patterning step or the like can be promoted. Accordingly, a ferroelectric capacitor having a ferroelectric film with excellent crystallinity can be formed. As a result, a ferroelectric capacitor with excellent hysteresis characteristics can be provided.

The method for forming a ferroelectric capacitor in accordance with the invention can be further implemented with any of the following modes.

(3) The method for forming a ferroelectric capacitor in accordance with an aspect of the embodiment of the invention may include the step of removing the mask by oxygen plasma treatment before the step (f).

According to this mode, the fluorine that has been adhered to the exposed surface of the ferroelectric layer or replaced with oxygen of the ferroelectric material in the step (f) can be prevented from being removed by an ashing process using oxygen plasma that may be conducted to remove a resist layer at the time of forming the ferroelectric capacitor.

(4) In the method for forming a ferroelectric capacitor in accordance with another aspect of the embodiment of the invention, the step (f) may include exposing the base substrate to a plasma atmosphere including fluorine.

(5) In the method for forming a ferroelectric capacitor in accordance with another aspect of the embodiment of the invention, raw material gas of the plasma containing fluorine may include at least one of $CF_4$, $C_2F_6$ and $NF_3$.

(6) In the method for forming a ferroelectric capacitor in accordance with another aspect of the embodiment of the invention, the ferroelectric layer may include at least one of Pb (Zr, Ti) $O_3$, $SrBi_2Ta_2O_9$, $Bi_4Ti_3O_{12}$, and $(Bi, La)_4 Ti_3O_{12}$.

(7) An electronic device in accordance with an embodiment of the invention includes a ferroelectric capacitor, and the ferroelectric capacitor is formed by the method for forming a ferroelectric capacitor described above.

(8) A ferroelectric capacitor in accordance with an embodiment of the invention includes a base substrate, a lower electrode formed above the base substrate, a ferroelectric layer containing ferroelectric material having oxygen formed on the lower electrode, and an upper electrode formed on the ferroelectric layer, wherein at least a portion of the oxygen of the ferroelectric material is replaced by fluorine.

(9) In the ferroelectric capacitor in accordance with an aspect of the embodiment of the invention, the ferroelectric layer may be composed of Pb (Zr, Ti) $O_{3-X} F_X$, where X is 0<X<3.

(10) An electronic device in accordance with an embodiment of the invention includes the ferroelectric capacitor described above.

BRIEF DESCRIPTION OF THE DRAWINGS

FIG. 10 is a view for describing a ferroelectric memory in accordance with an embodiment of the invention.

DESCRIPTION OF EXEMPLARY EMBODIMENTS

1. Ferroelectric Capacitor And Method For Forming Ferroelectric Capacitor

An example of a preferred embodiment of the invention is described below with reference to FIGS. 1-4. FIGS. 1-4 are cross-sectional views schematically showing a method for forming a ferroelectric capacitor in accordance with an embodiment of the invention.

Figure 1:
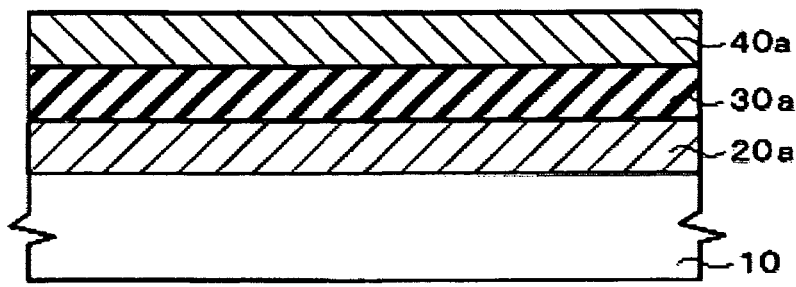
FIG. 1 is a view schematically showing a step of forming a ferroelectric capacitor in accordance with an embodiment of the invention.

(1) First, as shown in FIG. 1, a conductive layer 20a for a lower electrode (hereafter referred to as a "lower electrode layer 20a"), a layer 30a for a ferroelectric layer (hereafter referred to as a "ferroelectric layer 30a"), and a conductive layer 40a for an upper electrode (hereafter referred to as an "upper electrode layer 40a") are successively laminated on a base substrate 10.

The lower electrode layer 20a is not particularly limited to any material, as long as it can become an electrode of a ferroelectric capacitor. As the lower electrode layer 20a, for example, a precious metal such as Pt, Ir or the like, or its oxide (for example, $IrO_x$ or the like) may be used as its material. Further, the lower electrode layer 20a may be composed of a single layer of one kind of these materials, or a multilayered structure having laminated layers of plural kinds of these materials. The film forming method for forming the lower electrode layer 20a may be a known method such as a sputter method, a vacuum deposition method, a CVD method, or the like.

As the material of the ferroelectric layer 30a, PZT (Pb (Zr, Ti)$O_3$), SBT (Sr $Bi_2$ $Ta_2$ $O_9$), BIT ($Bi_4$ $Ti_3$ $O_{12}$), BLT ((Bi, La)$_4Ti_3$ $O_{12}$), or the like may be enumerated.

As the film forming method for forming the ferroelectric layer 30a, a solution coating method (including a sol-gel method, a MOD (Metal Organic Decomposition) method, and the like), a sputter method, and a CVD (Chemical Vapor Deposition) method (including a MOCVD (Metal Organic Chemical Vapor Deposition) method) may be enumerated.

The upper electrode layer 40a can use a material and a film forming method similar to those of the lower electrode layer 20a.

Figure 2:
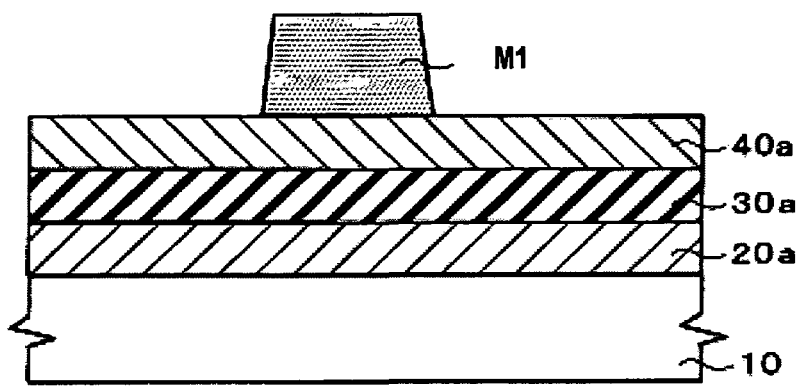
FIG. 2 is a view schematically showing a step of forming the ferroelectric capacitor in accordance with the embodiment of the invention.

(2) Next, as shown in FIG. 2, a mask layer M1 having a predetermined pattern is formed on the upper electrode layer 40a. In the present embodiment, an example in which a hard mask is formed is described. As the material of the mask layer M1, for example, silicon oxide, titanium nitride, titanium oxide, aluminum oxide, silicon nitride, and tungsten can be enumerated. The mask layer M1 may be composed of a single layer, or a laminated body of plural layers. In forming the mask layer M1, first, a hard mask (not shown) of the material described above is formed over the entire surface of the upper electrode layer 40a. Then, a resist layer (not shown) is formed on the hard mask layer by known photolithography method and etching technique. By using the resist layer as a mask, the hard mask layer is patterned by dry etching that uses ICP (inductively coupled plasma) plasma or the like, whereby the mask layer M1 is formed.

Figure 3:
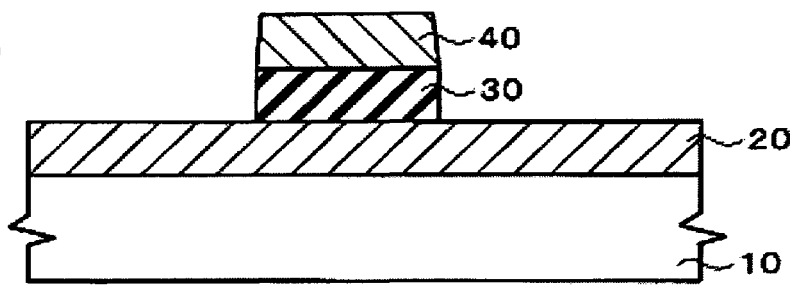
FIG. 3 is a view schematically showing a step of forming the ferroelectric capacitor in accordance with the embodiment of the invention.

(3) Then, as shown in FIG. 3, the upper electrode layer 40a and the ferroelectric layer 30a are patterned by dry etching. An appropriate etching method may be selected for etching the upper electrode layer 40a and the ferroelectric layer 30a depending on their materials. For example, a sputter etching method, a plasma etching method or the like can be used as the etching method. For example, when high density plasma such as ICP plasma is used, first, the upper electrode layer 40a is dry etched by using an etching gas containing halogen as its etching gas. As the etching gas containing halogen, for example, a mixed gas of chlorine and oxygen may be enumerated. Then, before the ferroelectric layer 30a is exposed, the etching gas is changed to an etching gas containing fluorine, and then the remaining portion of the upper electrode layer 40a and the ferroelectric layer 30a are etched. As the etching gas containing fluorine, fluorocarbon gas, such as, for example, $CF_4$ and $C_4F_8$ can be enumerated. The etching gas may include an inert gas such as argon gas or the like. Alternatively, the upper electrode layer 40a may be etched, the mask layer M1 may then be removed, and the ferroelectric layer 30a may be patterned by using the etched upper electrode layer 40a as a mask.

By the steps described above, a laminated structure of the lower electrode 20, the ferroelectric film 30 and the upper electrode 40 is formed.

Figure 4:
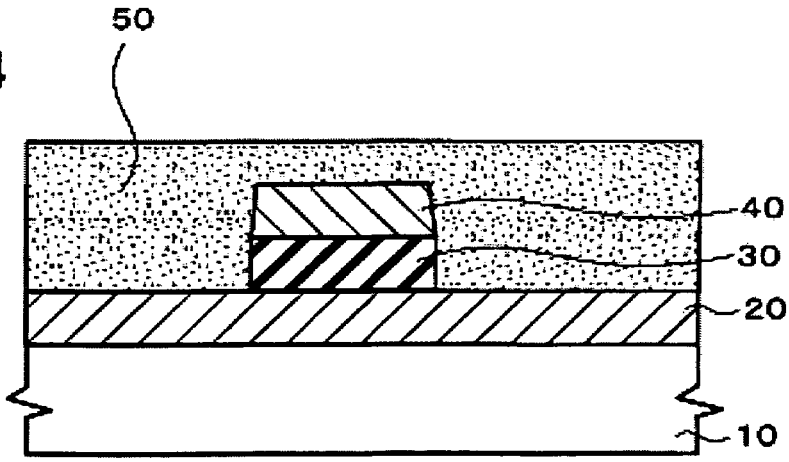
FIG. 4 is a view schematically showing a step of forming the ferroelectric capacitor in accordance with the embodiment of the invention.

(4) Next, fluorine is adhered to the surface of the ferroelectric layer 30 (which is hereafter referred to as "fluorine treatment"). Concretely, as shown in FIG. 4, the substrate 10 having the lower electrode 20, the ferroelectric film 30 and the upper electrode 40 laminated thereon is exposed to a fluorine plasma atmosphere 50. Any apparatus that is capable of generating plasma can be used in this treatment without any particular limitation. For example, a plasma etching apparatus that is used for etching the upper electrode layer 40a and the ferroelectric layer 30a can be used as it is. As the method for generating fluorine plasma, any one of various methods using, for example, a parallel flat plate type reactor, ICP, ECR, microwaves and the like can be used. As the raw material gas of fluorine plasma, CF type gas such as $CF_4$, $C_2F_6$ and $C_4F_8$, $SF_6$ and $NF_3$ can be used. The raw material gas can include inert gas such as argon gas, or oxygen gas. When gas with a high carbon rate such as $C_2F_6$, $C_4F_8$ or the like is used as the raw material gas, carbon deposits may be formed. In this case, a rinsing step using pure water to remove the deposits may preferably be provided before heat treatment to be described below.

Also, as the method for generating plasma, a method that can generate high density plasma, such as, an ICP method may preferably be used. When high density plasma is used, plasma can be generated at a low pressure, such that generation of radical can be suppressed, and damages that may be inflicted on a base layer can be reduced even when a silicon oxide layer is provided as the base layer.

Besides the aforementioned method of exposing the substrate to a fluorine plasma atmosphere, the fluorine treatment may be conducted by coating chemical containing fluorine on the substrate, dipping the substrate in such chemical, or washing the substrate with such as chemical.

(5) Next, heat treatment for recovering crystallinity is conducted. The heat treatment is conducted for recovering the crystal structure of the ferroelectric film 30 that has been destroyed by damages caused by the patterning step, and recovering its electrical characteristics. The heat treatment may be conducted at a slow heating rate by using a FA (furnace) or at a rapid heating rate by using a rapid thermal anneal method. The heat treatment may preferably be conducted in an oxygen atmosphere.

The heat treatment may preferably be conducted as early as possible after the fluorine treatment has been completed. This is because the adhered fluorine is lost as the time goes by, and thus the effect of advantageously progressing recovery of the crystallinity is diminished. Furthermore, if an oxygen plasma treatment is conducted as an ashing treatment or as a corrosion countermeasure after the fluorine treatment, the adhered fluorine may likewise be lost. For this reason, the treatment that uses oxygen plasma may preferably be conducted before the step (4).

By the steps described above, a ferroelectric capacitor in accordance with an embodiment can be formed. By the method for forming a ferroelectric capacitor in accordance with the present embodiment, the crystal structure of a ferroelectric layer can be recovered well by the heat treatment for recovering crystallinity, and a ferroelectric capacitor with improved electrical characteristics can be formed. The reason for which recovery of the crystallinity can be advantageously progressed by adhering fluorine to the surface of the ferroelectric film 30 is considered as follows. It is noted that, in the following consideration, cases in which PZT is used as the ferroelectric film 30 are described. After fluorine has adhered to the surface of the ferroelectric film 30 whose crystal structure has been damaged and destroyed, the fluorine diffuses in the ferroelectric layer 30. Because fluorine has an ion radius similar to that of oxygen, fluorine can replace oxygen. In other words, it is believed that the ferroelectric film 30 becomes to be composed of, for example, $Pb(Zr, Ti)O_{3-X}F_x$ (0<X<3). In this manner, as fluorine replaces oxygen, the fluorine functions as donor, and compensates for the charge of vacated lead. Therefore, recovery of the crystal structure can be promoted. As a result, by the forming method in accordance with the present embodiment, a ferroelectric capacitor with excellent electrical characteristics can be formed.

MODIFIED EXAMPLE

Figure 5:
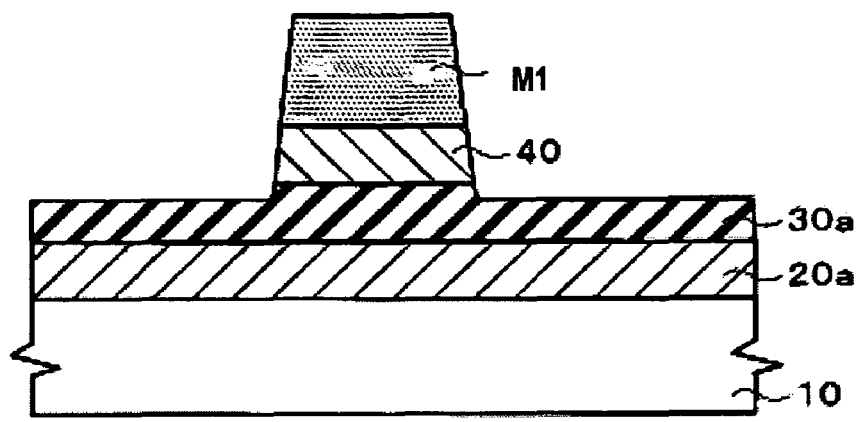
FIG. 5 is a view schematically showing a step of forming a ferroelectric capacitor in accordance with a modified example of the embodiment of the invention.

A modified example of the method for forming a ferroelectric capacitor in accordance with an embodiment is described with reference to FIG. 5. FIG. 5 is a cross-sectional view schematically showing a method for forming a ferroelectric capacitor in accordance with the modified example. The modified example is different from the embodiment described above in that its ferroelectric film 30 has a different pattern.

In the modified example, first, a lower electrode layer 20a, a ferroelectric layer 30a and an upper electrode layer 40a are formed on a base substrate 10 in a manner similar to the steps (1) and (2) described above, and then a mask layer M1 having a predetermined pattern is formed on the upper electrode layer 40a.

Next, as shown in FIG. 5, the upper electrode layer 40a and an upper portion of the ferroelectric layer 30a are dry etched, whereby these layers are patterned. Etching of the ferroelectric layer 30a may preferably be stopped immediately after the interface between the upper electrode layer 40a and the ferroelectric layer 30a is exposed. The timing "immediately after" is the timing, for example, when a change in the film thickness of the upper electrode / the dry etching rate of the upper electrode is calculated, or when a change in the spectral intensity caused by exposure of the ferroelectric layer when the upper electrode layer disappears is observed when the intensity of plasma emission spectrum during dry etching is monitored. Etching of the ferroelectric layer 30a may be stopped with an addition of about 10% over etching, in consideration of the in-plane uniformity of the wafer.

Then, fluorine treatment and heat treatment for recovering crystallinity are conducted in a manner similar to the steps (4) and (5) in accordance with the embodiment described above. By the steps described above, a ferroelectric capacitor in accordance with the modified example can be formed.

According to the modified example, the surface of the ferroelectric layer 30 to which fluorine is adhered is increased, such that recovery of the crystallinity can be more advantageously promoted. As a result, a ferroelectric capacitor with excellent electrical characteristics can be provided.

2. Experimental Example

Experimental examples of ferroelectric capacitors in accordance with embodiments of the invention are described below.

2.1. First Experiment

Figure 6:
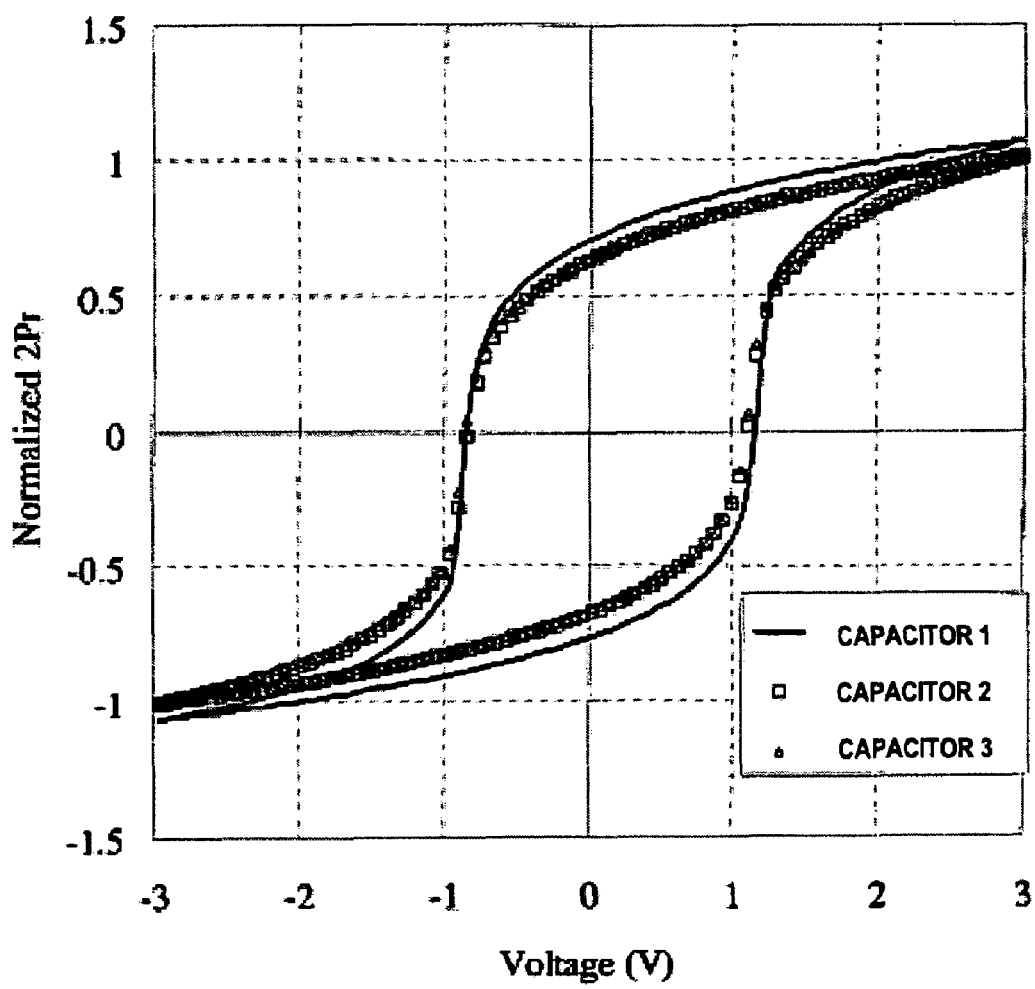
FIG. 6 is a graph showing a measurement result of a first experiment.
Figure 7:
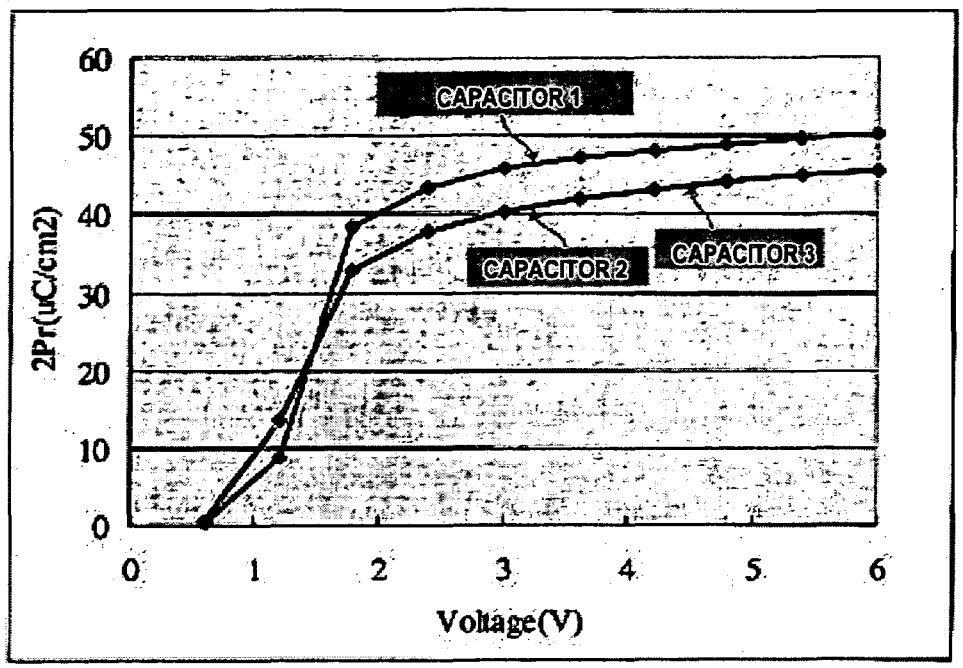
FIG. 7 is a graph showing a measurement result of the first experiment.

In the first experimental example, a laminated body of a lower electrode 20, a ferroelectric film 30 and an upper electrode 40 was formed. With the laminated body, a ferroelectric capacitor 1 to which fluorine plasma treatment was applied, a ferroelectric capacitor 2 to which chlorine plasma treatment was applied, and a ferroelectric capacitor 3 to which no treatment was applied were formed. Then, their hysteresis characteristics were measured to thereby obtain their polarization values. FIG. 6 shows hysteresis curves of the ferroelectric capacitors 1-3, and FIG. 7 shows the measured results of polarization values.

First, methods for forming the ferroelectric capacitors 1-3 are described. It is noted that, in the following description, the method for forming the ferroelectric capacitor 1 is first described, and then as for the ferroelectric capacitors 2 and 3, only features different from the ferroelectric capacitor 1 are described.

(a) Formaing of Laminated Body

As a lower electrode layer 20a, a laminated body of a $TiO_2$ layer having a film thickness of 40 nm and a Pt layer having a film thickness of 200 nm was formed on a base substrate by a sputter method. Then, as a ferroelectric layer 30a, a PZTN film having a film thickness of 150 nm was formed on the lower electrode layer 20a by a spin coat method and heat treatment. Then, as an upper electrode layer 40a, a Pt layer having a thickness of 200 nm was formed on the ferroelectric layer 30a by a sputter method. Then, as a mask layer M1, a resist layer was formed, and patterned by a known method.

Then, by using the mask layer M1 as a mask, the upper electrode layer 40a and the ferroelectric layer 30a were etched. The upper electrode layer 40a may be etched, using a dry etching apparatus with high density plasma such as ICP, at a low pressure lower than 1.0 Pa with a mixed gas of chlorine gas and argon gas. The ferroelectric layer 30a may be etched, using a similar apparatus, with a mixed gas of fluorine based gas such as $CF_4$ and argon gas. Then, the resist mask was removed by ashing with oxygen plasma for removing the mask layer M1. By the steps described above, a laminated body, which is a base structure of a ferroelectric capacitor, was formed.

(b) Fluorine Adhering Treatment

Next, fluorine was adhered to the surface of the ferroelectric film of the formed laminated body. Concretely, the substrate with the laminated body formed thereon was exposed to a fluorine plasma atmosphere for 60 seconds. Fluorine plasma was generated under conditions in which the raw material gas, for example, $CF_4$ gas was supplied at 100 sccm at a pressure of 1.0 Pa, the power applied to the source was 900 W, and the bias power was 0W. In particular, application of power to the bias side advances etching of the base layer, and therefore is not preferred.

(c) Heat Treatment for Recovering Crystallinity

Next, heat treatment was conducted in an oxygen atmosphere at 725° C. for 5 minutes, as the heat treatment for recovering crystallinity.

By the steps (a)-(c) described above, the ferroelectric capacitor 1 was formed.

In forming the ferroelectric capacitor 2, the step (b) was different compared to the ferroelectric capacitor 1. In the sample 2, the substrate was exposed to a chlorine plasma atmosphere in the step (b). The chlorine plasma was generated under conditions in which chlorine gas was supplied at 100 sccm at a pressure of 1.0 Pa, and the power applied to the source was 900 W. In forming the ferroelectric capacitor 3, the ferroelectric capacitor was formed without conducting the step (b).

It is clear from FIG. 6 that the ferroelectric capacitor 1 had a hysteresis profile with an improved squareness compared to the ferroelectric capacitors 2 and 3. Also, as shown in FIG. 7, the ferroelectric capacitor 1 had greater polarization values compared to the ferroelectric capacitors 2 and 3. As a result, it was confirmed that, by conducting fluorine adhering treatment, a ferroelectric capacitor with excellent characteristics could be formed.

2.2. Second Experiment

Next, a second experiment is described. In the second experiment, a variety of samples was formed by conducting or not conducting ashing with oxygen plasma after the step (b) was finished until the step (c) was started, and changing the temperature of heat treatment in the step (c) to various levels. Concretely, these conditions are shown in Table 1 below. Also, conditions in the steps (b) and (c) that are not shown in Table 1 were set in a manner similar to the first experiment.

TABLE 1

| Ferroelectric Capacitor No. | Presence or Absence of Step (b) | Presence or Absence of Ashing Step after Step (b) | Treatment Temperature (° C.) of Step (c) |
|---|---|---|---|
| 21 | Present | Absent | 725 |
| 22 | Present | Present | 725 |
| 23 | Absent | Absent | 725 |
| 24 | Present | Absent | 650 |
| 25 | Absent | Absent | 675 |
| 26 | Present | Absent | 675 |
| 27 | Absent | Absent | 700 |

Figure 8:
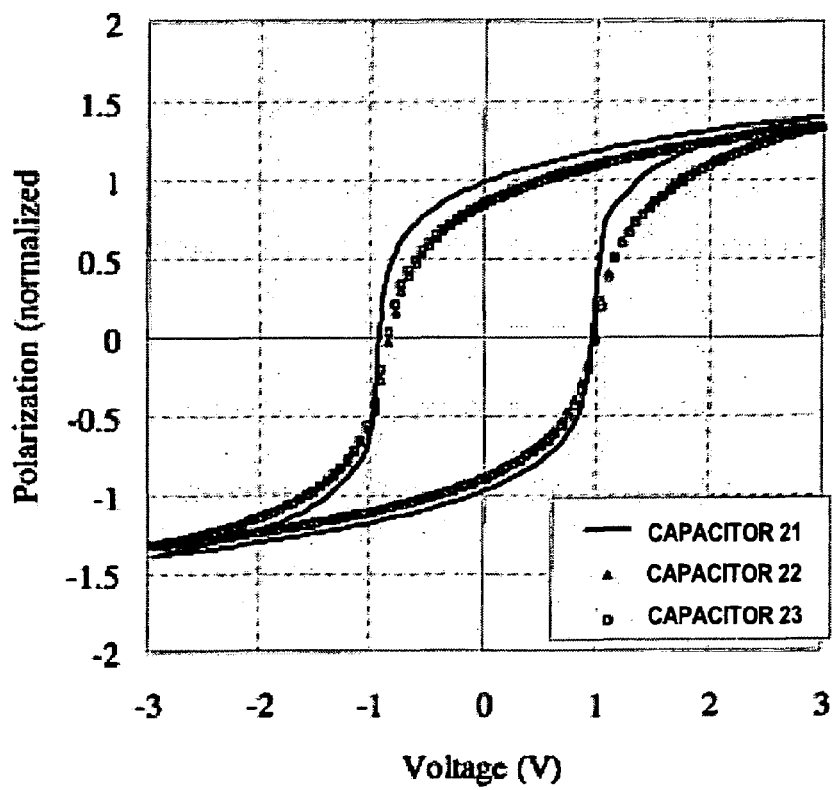
FIG. 8 is a graph showing a measurement result of a second experiment.

FIG. 8 shows hystereses of the ferroelectric capacitors 21 through 23.

It is clear from FIG. 8 that the squareness of hysteresis and the value of Pr improve when the step (b) is conducted, but its effectiveness is lost when the ashing step with oxygen plasma is conducted after the step (b). This is believed to occur because fluorine adhered to the ferroelectric film 30 is removed by oxygen plasma. Accordingly, it is confirmed that ashing with oxygen plasma is preferably conducted before the step (b) when such step needs to be conducted.

Figure 9:
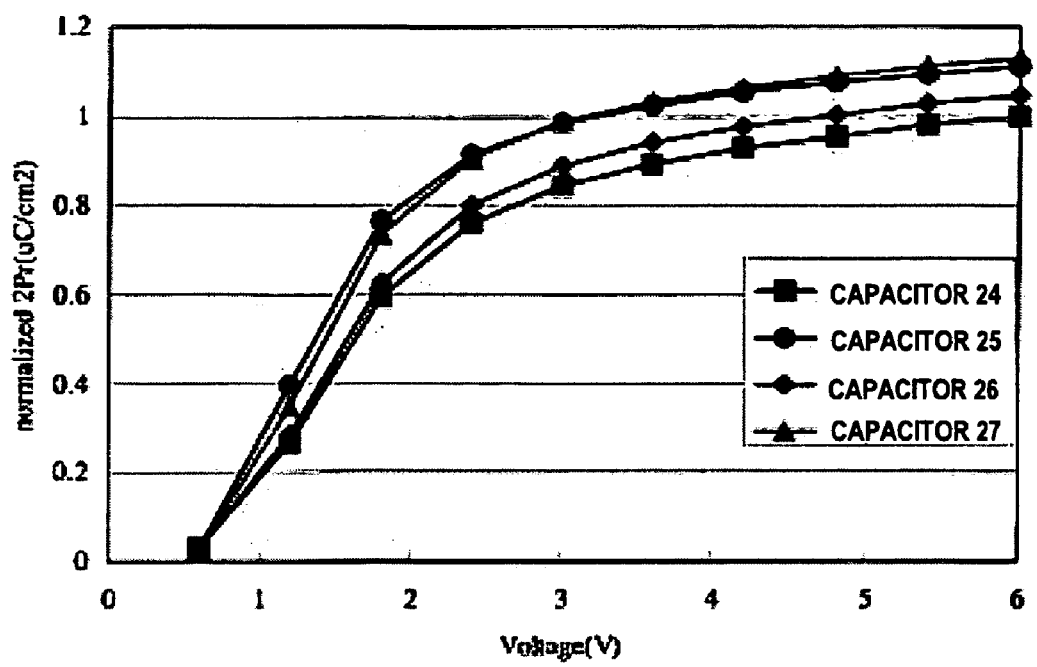
FIG. 9 is a graph showing a measurement result of the second experiment.

FIG. 9 is a diagram showing remanent polarizations of the ferroelectric capacitors 24 through 27. Although the ferroelectric capacitors 24 and 25 and the ferroelectric capacitors 26 and 27 are heat treated at different temperatures, it is observed that they exhibit generally the same characteristics. It is found from the above that, when ferroelectric capacitors with similar characteristics are to be obtained, satisfactory characteristics can be obtained by heat treatment at lower temperatures when the treatment of the step (b) is conducted. In other words, the process can be conducted at lower temperatures.

3. Electronic Device

Next, electronic devices including ferroelectric capacitors in accordance with the present embodiment are described.

It is noted that, as the electronic devices, ferroelectric memories, piezoelectric elements, ink jet type recording heads of ink jet printers and the like may be enumerated.

3.1. Ferroelectric Memory

Next, a ferroelectric memory including a ferroelectric capacitor in accordance with the present embodiment is described.

FIG. 10A and FIG. 10B are views schematically showing a ferroelectric memory device 1000 that uses a ferroelectric capacitor obtained by the manufacturing method in accordance with the present embodiment described above. It is noted that FIG. 10A shows a plane configuration of the ferroelectric memory device 1000, and FIG. 10B shows a cross section taken along a line I-I in FIG. 10A.

The ferroelectric memory device 1000 has a memory cell array 200 and a peripheral circuit section 300, as shown in FIG. 10A. The memory cell array 200 and the peripheral circuit section 300 are formed in different layers, respectively. The peripheral circuit section 300 is formed on a semiconductor substrate 400 in an area that is different from the memory cell array 200. As a concrete example of the peripheral circuit section 300, a Y-gate, a sense amplifier, an I/O buffer, an X-address decoder, a Y-address decoder, or an address buffer can be enumerated.

The memory cell array 200 includes lower electrodes (word lines) 210 for selection of rows, and upper electrodes (bit lines) 220 for selection of columns, which are disposed intersecting one another. Also, the lower electrodes 210 and the upper electrodes 220 are arranged in stripes composed of a plurality of line shaped signal electrodes. It is noted that the signal electrodes can be formed such that the lower electrodes 210 may define bit lines, and the upper electrodes 220 may define word lines.

As shown in FIG. 10B, a ferroelectric film 215 is disposed between the lower electrodes 210 and the upper electrodes 220. In the memory cell array 200, memory cells that function as ferroelectric capacitors 230 are formed in areas where the lower electrodes 210 and the upper electrodes 220 intersect one another. Ferroelectric capacitors in accordance with the present embodiment are applied as the ferroelectric capacitors 230.

Further, the ferroelectric memory device 1000 includes a second interlayer insulation film 430 formed to cover the lower electrodes 210, the ferroelectric film 215 and the upper electrodes 220. In addition, an insulating protection layer 440 is formed on the second interlayer insulation film 430 to cover wring layers 450 and 460.

The peripheral circuit section 300 includes various circuits that selectively write or read information in or from the above-described memory cell array 200 shown in FIG. 10A. For example, the peripheral circuit section 300 is formed from a first driving circuit 310 that selectively controls the lower electrodes 210, a second driving circuit 320 that selectively controls the upper electrodes 220, and a signal detection circuit such as a sense amplifier (omitted in the figure) and the like.

Also, the peripheral circuit section 300 includes MOS transistors 330 formed on the semiconductor substrate 400, as shown in FIG. 10B. The MOS transistor 330 has a gate insulation layer 332, a gate electrode 334, and source/drain regions 336. The MOS transistors 330 are isolated from one another by element isolation areas 410. A first interlayer insulation layer 420 is formed on the semiconductor substrate 400 on which the MOS transistors 330 are formed. Further, the peripheral circuit section 300 and the memory cell array 200 are electrically connected to one another by a wiring layer 51.

Figure 11:
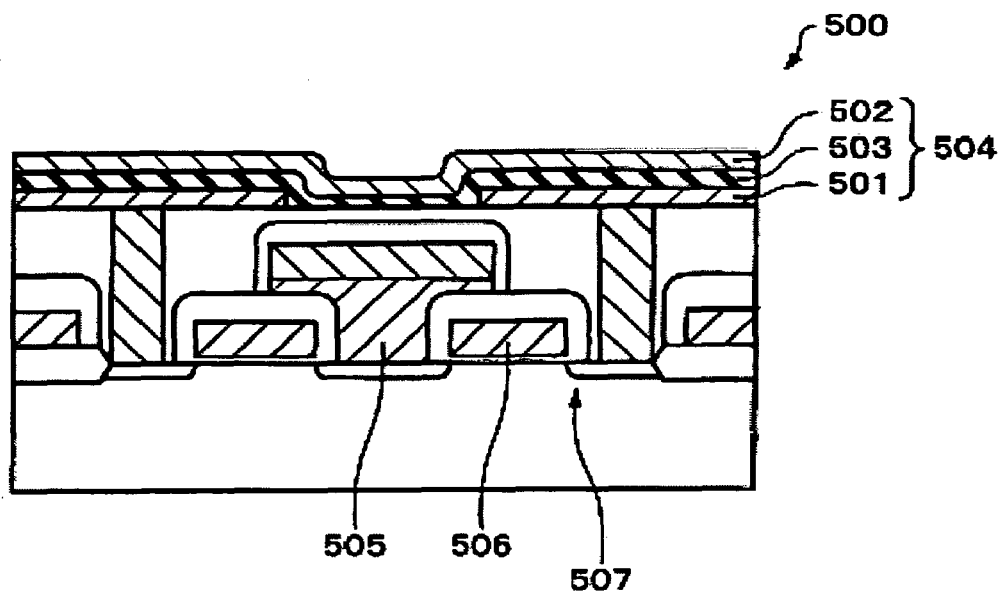
FIG. 11 is a view for describing a ferroelectric memory in accordance with an embodiment of the invention.
Figure 12:
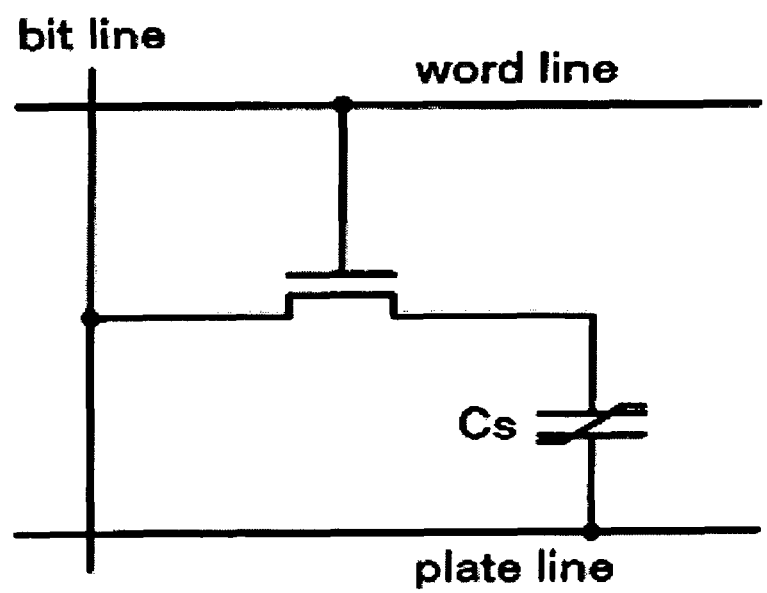
FIG. 12 is a view for describing a ferroelectric memory in accordance with an embodiment of the invention.

FIG. 11 shows the structure of a 1T1C type ferroelectric memory device 500 as another example of a ferroelectric memory. FIG. 12 shows an equivalent circuit diagram of the ferroelectric memory device 500.

As shown in FIG. 11, the ferroelectric memory device 500 is a memory element having a structure similar to that of a DRAM, which is formed from a capacitor 504 (1C) composed of a lower electrode 501, an upper electrode 502 that is connected to a plate line and a ferroelectric film 503, and a switching transistor element 507 (1T) having source/drain electrodes, one of them being connected to a data line 505, and a gate electrode 506 that is connected to a word line. Because the 1T1C type memory can perform writing and reading at high-speeds at 100 ns or less, and its written data is nonvolatile, it is promising as a replacement of SRAM.

Because the ferroelectric memory in accordance with the present embodiment is formed by using the ferroelectric capacitor 504 with excellent electrical characteristics in accordance with the present embodiment described above, a ferroelectric memory device with improved performance can be provided. Also, the ferroelectric film 503 can be crystallized at low temperatures, and mix-mounting with semiconductor elements such as MOS transistors can be realized. The ferroelectric memory device in accordance with the present embodiment can also be applied to 2T2C type ferroelectric memory devices without being limited to the above.

3.2 Piezoelectric Element

Next, an example in which the ferroelectric capacitor in accordance with the present embodiment is applied to a piezoelectric element is described. In other words, an example in which the ferroelectric film of the present embodiment is used as a piezoelectric film is described.

Figure 13:
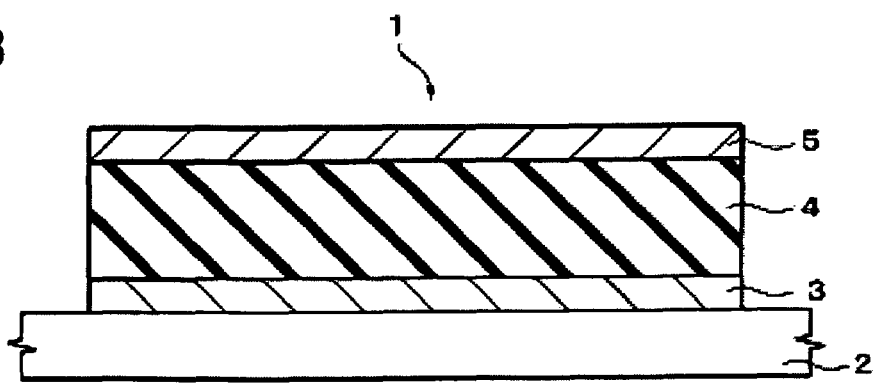
FIG. 13 is a view for describing a piezoelectric element in accordance with an embodiment of the invention.

FIG. 13 is a cross-sectional view showing a piezoelectric element 1 in accordance with the present embodiment. The piezoelectric element 1 includes a substrate 2, a lower electrode 3 formed on the substrate 2, a piezoelectric film (ferroelectric film) 4 formed on the lower electrode 3, and an upper electrode 5 formed on the piezoelectric film 4.

As the substrate 2, for example, a silicon substrate can be used. In the present embodiment, a single-crystal silicon substrate with a (110) orientation is used for the substrate 2. Also, as the substrate 2, a single-crystal silicon substrate with a (100) orientation, or a single-crystal silicon substrate with a (111) orientation can be used. Also, as the substrate 2, a substrate in which an amorphous silicon oxide film such as a thermal oxidation film or a natural oxidation film is formed on the surface of a silicon substrate can be used.

The lower electrode 3 is one of electrodes for applying a voltage to the piezoelectric film 4. The lower electrode 3 can be formed, for example, in the same plane configuration as that of the piezoelectric film 4. The lower electrode 3 may be formed to a film thickness, for example, of the about 100 nm-200 nm. The piezoelectric film 4 is a film having a perovskite type structure. The lower electrode 3 and the upper electrode 5 can be formed by, for example, a sputter method, a vacuum deposition method, or the like. The lower electrode 3 and the upper electrode 5 consist of, for example, Pt (platinum). It is noted that the material of the lower electrode 3 and the upper electrode 5 is not limited to Pt, but, for example, Ir (iridium), $IrO_x$ (iridium oxide), Ti (titanium), $SrRuO_3$ or the like can also be used.

In accordance with the present embodiment, a piezoelectric element with excellent piezoelectric characteristics can be provided. The piezoelectric element in accordance with the present embodiment may preferably be used in an ink jet type recording head of an ink jet printer.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for forming a ferroelectric capacitor, comprising the steps of:
   (a) forming a first conductive layer above a base substrate;
   (b) forming a ferroelectric layer containing ferroelectric material having oxygen on the first conductive layer;
   (c) forming a second conductive layer on the ferroelectric layer;

(d) forming a mask on the second conductive layer;
(e) etching at least the second conductive layer using the mask, to form a capacitor composed of the first conductive layer, the ferroelectric layer and the second conductive layer;
(f) replacing at least a portion of the oxygen of the ferroelectric material with fluorine after the step (e); and
(g) applying heat treatment to the capacitor.

* * * * *